United States Patent [19]
Kasai et al.

[11] Patent Number: 4,707,565
[45] Date of Patent: Nov. 17, 1987

[54] SUBSTRATE FOR PRINTED CIRCUIT

[75] Inventors: Shin Kasai; Hideharu Waketa; Keiichi Kato; Yutaka Kawaguchi, all of Fukushima, Japan

[73] Assignee: Nitto Boseki Co., Ltd., Japan

[21] Appl. No.: 840,149

[22] Filed: Mar. 17, 1986

[30] Foreign Application Priority Data

Mar. 19, 1985 [JP] Japan .................................. 60-55550
Oct. 31, 1985 [JP] Japan ................................ 60-244444

[51] Int. Cl.$^4$ ............................................. H05K 1/00
[52] U.S. Cl. .................................. 174/68.5; 428/248; 428/251
[58] Field of Search ............... 174/68.5; 428/248, 251, 428/901

[56] References Cited

U.S. PATENT DOCUMENTS

| | | | |
|---|---|---|---|
| 2,561,449 | 7/1951 | Ruderman | 428/251 |
| 2,688,006 | 8/1954 | Steinman | 428/251 X |
| 4,452,847 | 6/1984 | Siemon | 174/68.5 X |
| 4,477,512 | 10/1984 | Thomas et al. | 428/901 X |
| 4,501,787 | 2/1985 | Marchetti et al. | 428/901 X |
| 4,563,385 | 1/1986 | Bhatt et al. | 428/251 |

FOREIGN PATENT DOCUMENTS

196243 7/1984 Japan .................................. 428/251

Primary Examiner—Morris H. Nimmo
Attorney, Agent, or Firm—Gerald J. Ferguson, Jr.; Michael P. Hoffman; Michael J. Foycik, Jr.

[57] ABSTRACT

In a substrate of a printed circuit, a metal foil is mounted onto at least one of the outermost surfaces of a laminate made of a plurality of glass fiber woven fabrics impregnated with synthetic resin, and heated and pressed. Warps and wefts of the glass fiber fabrics filamentated their filaments. The synthetic resin enters gaps among the opening filaments so that the vertically laminated glass fiber fabrics including the opening fibers are integrally jointed with each other. Warps and wefts of the glass fiber fabrics may have their surfaces made fuzzy so that the synthetic resin enters fuzzy filaments. Furthermore, the thus produced substrate may be used as a multilayer printed circuit substrate.

7 Claims, 13 Drawing Figures

∿∿∿∿ WE 116E GLASS CLOTH

⌒⌒⌒ WE 18W GLASS CLOTH

⋈⋈⋈⋈ OPENED WE 18W GLASS CLOTH

SUBSTRATE FOR PRINTED CIRCUIT

BACKGROUND OF THE INVENTION

The present invention relates to a substrate for a printed circuit for use in computers or various kinds of communication appliances.

With the advance of computers or various kinds of communication appliances, demand for printed circuit substrates of glass fiber-epoxy resin has increased and characteristics required for the printed circuit substrates have become higher and higher as the communication appliances have been made to have high performance and have been miniaturized.

Figure 3:
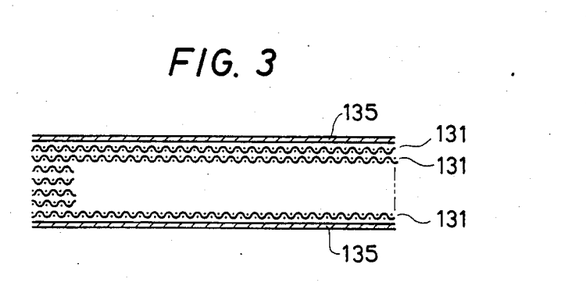
FIG. 3 is a view for explanation of the substrate for a printed circuit.

In the form of glass fiber used in printed circuit substrates, there are various kinds of materials, such as woven fabric or cloth, nonwoven fabric (including paper type nonwoven fabric), choped strand mat, continuous strand or swirl mat or the like. These materials are used appropriately in combination in accordance with the purpose of use, but the most general material of them is woven fabric or cloth. Generally, as shown in FIG. 3, six to eight sheets of woven fabrics 131 are laminated and impregnated with synthetic resin, and then metal foil 135 is mounted onto at least one of the outermost surfaces of the laminate. The thus laminated body is heated and pressed to form a substrate.

Figure 4:
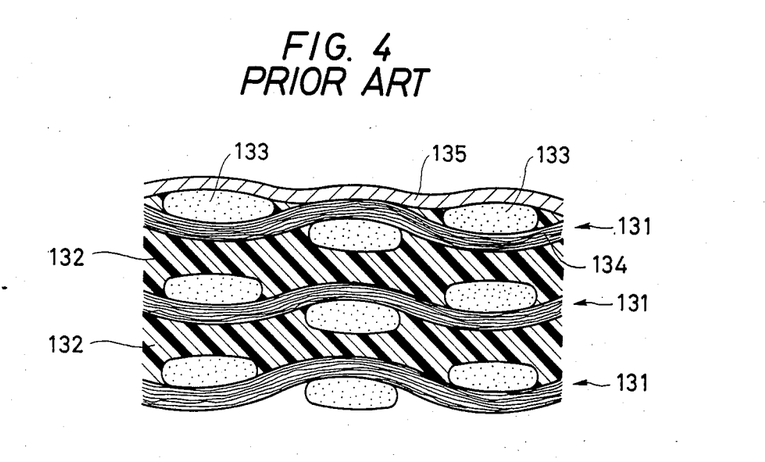
FIG. 4 is an enlarged sectional view of important parts in the conventional substrate.

A substrate using glass fiber fabric has a great advantage of excellent reinforcement effect, since a glass fiber content can be increased and a mechanical strength of the glass fiber fabric is large. In the case where the glass fiber fabrics are laminated to make a substrate for a printed circuit, however, there is a problem in surface smoothness and there often occurs a defect of delamination, due to inherent factors of fabric. That is, a glass fiber forming fabric is generally a mono-filament having a filament diameter of from 5 to 9 $\mu$m. Several hundreds of filaments are bound and slightly twisted for the purpose of keeping the form of a thread, to use as a warp or weft. Accordingly, the glass fiber filaments forming fabric have a degree of freedom greatly restricted by twisting and weaving processes. In the conventional substrate for a printed circuit, as shown in FIG. 4, the glass fiber fabrics 131 are unified by the synthetic resin 132. The warps 133 and wefts 134 forming each fabric 131 are made compact and tightened, and there is a gap or clearance between the adjacent warps 133 and 133. In this case, the synthetic resin 132 exists mainly between the adjacent fabrics 131, so that the glass fiber fabrics 131 are made into the laminated and stuck state through the resin. Additionally, the metal foil 135 mounted on the surface of the laminate is made wavy microscopically by the intersection between the warp 133 and weft 134 of the upper most glass fiber fabric 131, so that the surface smoothness thereof is unsatisfactory.

Such a problem in surface smoothness has become a large factor for the improvement in wiring density in a printed circuit with the advance of high performance and miniaturization of appliances and a large factor for the reliability of circuits with the advance of fineness of patterns. This is the problem to be solved in the art of substrates for printed circuits. Although the surface smoothness of the standard double-face board (1.6 mm thick) is about 7–9 $\mu$m, an improvement to make the surface smoothness to about 3 $\mu$m is required today.

Since each of the warp 133 ad weft 134 forming the glass fiber fabric 131, as shown in FIG. 4, is formed by binding and twisting several hundreds of glass fiber filaments, it is difficult to make the resin 132 enter the inside spaces of the warp 133 and weft 134. The difficulty of impregnation with the resin 132 causes unevenness of the resin in the laminated substrate. This not only exerts a bad influence upon mechanical, thermal, and electrical characteristics but also directly affects the manufacturing speed, thereby causing inefficiency.

In addition, the unsatisfactoriness in impregnating the warp 133 and weft 134 with the resin 132 causes unsatisfactoriness in adhesion of laminated glass fiber fabrics 131, and accordingly, causes delamination.

As one of the other important characteristics required for a substrate for a printed circuit, there is a hole-forming working property. The hole-forming working is an important process for boring holes to fix parts mounted onto the substrate and to connect circuits on the respective layers. The hole-forming working is generally categorized into two methods of punching working and drilling working. Of course the punching working is low in cost. Although the former has been mainly used to paper phenol type substrates, it has been not applied to substrates using glass fiber fabrics because of the severe abrasion in molds, the poor result in finishing on the inner walls of punched holes, etc. Therefore, the latter has been generally used to the substrates of glass fiber fabrics.

However, also in the drilling working, abnormal cracks and breaks have occur during hole cutting on occasion. That is, glass fiber fabric has filaments not opened to make impregnation with resin unsatisfactory, so that there arises unevenness in composition of glass fiber fabric and resin in the laminate. The unevenness is unsuitable for drilling working. Accordingly, the drilling speed cannot be increased during drilling working; cracks and breaks arise easily; and hole-walls cannot be finished up with a good result.

The abnormality of the hole-walls causes incompletion of through-hole portions, resulting in lowering in reliability of circuits. As described above, hole-forming working in printed circuit substrates is an important factor for the reliability of circuits depending on the kind of the printed circuit substrate, and this factor greatly affects workability in manufacturing the substrates.

To improve the characteristics in surface smoothness and impregnation, conventionally, various methods, such as the improvement in form of threads forming fabric, the use of nonwoven fabric, the application of shear stress to fabric by a roller, etc., have been proposed. Further, to improve the characteristics in delamination of glass fiber fabric, various methods, such as a method of gigging fabric by needle punching working, or the like, have been proposed. These methods are effective to improve the surface smoothness and delamination in the case of use of nonwoven fabric. However, the filaments of nonwoven fabric are not mutually intertwined and not restricted, so that the form of nonwoven fabric is kept by an adhesive agent. Therefore, the adhesive agent must match with the resin with which the nonwoven fabric is impregnated. In addition, since the filaments or threads of nonwoven fabric are not mutually restricted, the glass fiber content of nonwoven fabric is a half or less (about 30%) of that of woven fabric. Accordingly, the reinforcement effect by glass fiber is, of course, low, so that nonwoven fabric has a defect of poor dimensional stability, and the above-mentioned problems have been not completely solved by the improvement in threads forming fabric, the application of shear stress by a roller, etc.

Further, in the case where needle punching is performed onto fabric to improve delamination troubles, such as destruction of constituent threads by complete cutting off, displacement of seams, or partly-not-needle-punched fabric, often arises. Accordingly, it is impossible to perform uniform gigging and densely fuzzing working in practice. The cut-off destruction of constituent threads causes unevenness of fabric. In addition, since needle punching working provides punched and non-punched portions so that surface smoothness may be deteriorated.

Further, to improve the hole-forming workability, there have been proposed attempts such as use of glass fiber paper as a basic material or use of glass fiber paper in the core portion of a substrate so that glass fiber fabrics are stacked onto the opposite surfaces of the core glass fiber paper (CEM-3 type). Although the hole-forming workability is improved and punching working is feasible to a certain degree by the attempts, glass fiber content is not improved in the case of using glass fiber paper as well as in the above-described case of using nonwoven fabric. Accordingly, the attempts are unsatisfactory in the reinforcement effect.

Recently, in the field of electronics appliances mount techniques, a surface mount technique (SMT) has become to be widely used. One of the most remarkable characteristics of a printed-circuit substrate for SMT is that the substrate is formed with a lot of via-holes of a small diameter (0.3 mm or less), and therefore it is an important problem how to cut such via-hole with high accuracy, high reliability and high efficiency in a thick substrate, that is, in a substrate having a large aspect ratio.

In the printed-circuit substrate using conventional glass fiber fabrics, however, there have been difficulties in accuracy in positions of and change in dimensions of the via-holes in boring holes by using a drill of a small diameter. Accordingly, it is required to improve the glass fiber per se.

Figure 6:
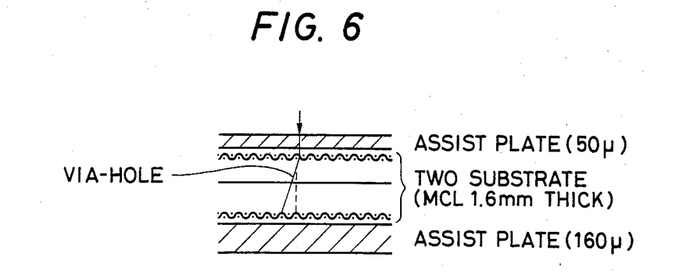
FIG. 6 is a view for explanation of the displacement of the via-holes in the rear surface of SMT in the conventional substrate.

That is, in the case where hole-boring is performed by using the small-diameter drill in a substrate having a large aspect ratio, there is such a defect that the top of the drill strikes against the glass fiber so that the hole formed in the rear surface displaces, as indicated by a solid line in FIG. 6, so as to make it difficult to form a vertical via-hole. Even in the case where via-hole could be formed accurately in a substrate, there is a possibility that a dimensional change arises in the substrate after after-treatments such as etching, heating, etc., so that the accurate via-holes become distorted.

OBJECTS AND SUMMARY OF THE INVENTION

An object of the present invention is to provide a substrate for a printed circuit employing glass fiber fabric, in which the properties are improved in surface smoothness and delamination and which is excellent in hole-forming working.

According to a first aspect of the present invention, a substrate for a printed circuit, in which metal foil is mounted onto at least one of the outermost surfaces of a laminate made of a plurality of glass fiber woven fabrics impregnated with synthetic resin, and heated and pressed, is characterised in that warps and wefts of the glass fiber fabrics have their filaments open, and the synthetic resin enters gaps among the opening filaments so that the vertically laminated glass fiber fabrics including the opening fibers are integrally jointed with each other.

According to a second aspect of the present invention, a substrate for printed circuit, in which metal foil is mounted onto at least one of the outermost surfaces of a laminate made of a plurality of glass fiber woven fabrics impregnated with synthetic resin, and heated and pressed, is characterized in that warps and wefts of the glass fiber fabrics have their filaments open and their surfaces made fuzzy, and the synthetic resin enters gaps among the opening and fuzzy fibers so that the vertically laminated glass fiber fabrics including the opening and raising filaments are integrally jointed with each other.

Still another object of the present invention is to provide an inexpensive multilayer printed circuit substrate in which expensive thin glass cloth (for example, WE116EBZ$_2$ made and sold by Nitto Boseki K.K.) having been used in a conventional multilayer printed circuit substrate is replaced by general purpose glass cloth (for example, WE18WBZ$_2$), whereby the properties such as high-level surface smoothness, thickness accuracy, dimensional accuracy, and heat-resistance, can be kept and the positional accuracy, and heat-resistance, can be kept and the positional accuracy in forming small-diameter via-holes according to SMT is superior, which have been considered difficult conventionally.

According to the present invention, the multilayer printed circuit substrate arranged such that a plurality of glass cloth prepegs impregnated with synthetic resin are laminated, metal foil is mounted onto outermost surfaces thereof, and the laminate is heated and pressed, is featured in that warps and wefts of the glass cloth have their filaments opened, and the synthetic resin enters gaps among the opening filaments to thereby integrally joint the laminated glass prepegs to each other.

DESCRIPTION OF THE PREFERRED EMBODIMENTS

The woven fabric used in the printed circuit substrate according to the present invention is woven by constituent threads made of an aggregate of several hundreds of glass fiber monofilaments having a 5–9 μm filament diameter. Further, the filaments forming warps and wefts are disjointed or opened by application of some mechanical impact (for example, injection of a high-pressure water jet to the surfaces thereof, etc.). Further, fine fuzz is provided densely and almost uniformly. Table 1 shows the changes in the impregnation characteristic of resin in the case where high-pressure water jetting was applied onto the surfaces of fabric while changing the pressure thereof. The resin used herein was epoxy resin composed of the following components.

| | |
|---|---|
| EPICOAT 1001 (epoxy resin: made by Shell Kagaku K. K.) | 100 parts by weight |
| Dicyandiamide | 2 parts by weight |
| Benzyldimethylamine | 0.2 parts by weight |
| Methyloxytol (Applox.) | 100 parts by weight |

The apparatus for generating high-pressure water jet, which has been disclosed in Japanese Publication No. 57-22692, was used and all the glass fiber fabrics used were articles of commerce made and sold by Nitto Boseki Co., Ltd.

TABLE 1

| | Jetting Press. (Kg/cm$^2$) | WE18WEZ$_2$ | WE116EBZ$_2$ |
|---|---|---|---|
| | | | (unit: minute-second) |
| Blank | — | 15′-42″ | 7′-38″ |
| No. 1 | 50 | 4′-30″ | 1′-52″ |
| No. 2 | 100 | 3′-02″ | 1′-11″ |
| No. 3 | 200 | 1′-22″ | 33″ |
| No. 4 | 300 | 18″ | 14″ |
| No. 5 | 500 | 15″ | 8″ |

(Note)
"Blank" represents glass fiber fabric which has not been treated by high-pressure water jetting.

The resin impregnation that is a test for measuring time required from dropping of a given quantity (10 cc) of resin onto a given area (10 cm × 10 cm) of fabric until coming out of bubbles within strands.

As apparent in Table 1, it is recognized that the filaments of the warps and wefts are opened by the water jetting to thereby greatly improve the resin impregnation speed, and, particularly, the impregnation speed can be more greatly improved by higher-pressure jetting. In high-pressure water jetting with a pressure of 200 Kg/cm$^2$ or more, fuzzing of the surfaces arises.

Table 2 shows the changes in resin content in the case of using the same glass fiber fabric as used in the impregnation test. Each of the glass fiber fabric and resin composition used herein is the same as used in the impregnation test.

TABLE 2

| | Jetting Press. (Kg/cm$^2$) | WE18WBZ$_2$ | WE116EBZ$_2$ |
|---|---|---|---|
| | | | (unit: %) |
| Blank | — | 39.0 | 48.0 |
| No. 1 | 50 | 41.6 | 50.0 |
| No. 2 | 100 | 43.2 | 54.1 |
| No. 3 | 200 | 46.7 | 58.8 |
| No. 4 | 300 | 52.5 | 67.4 |
| No. 5 | 500 | 58.3 | 78.5 |

The test was in accordance with JIS R 3420 5.3 "Glass Fiber General Test".

As apparent in Table 2, it is recognized that the resin content increases as the jetting pressure is made higher, and, particularly, the resin content more increases compared with "Blank" when the jetting pressure is made high to 200 Kg/cm$^2$ or more since the surfaces of the warps and wefts are made fuzzy.

As described above, according to the first aspect of the invention, the filaments of the warps and wefts forming glass fiber fabric are disjointed or opened, and consequently, resin impregnation into the warps and wefts can be made rapidly and uniformly upon the whole fabric so that a heat-press effect in curing can be completely exhibited. In addition, since the flaments of the warps and wefts are disjointedly opened, they become flat by heating and pressing at laminating as well as the intersections of the warps and wefts also become flat, and therefore the surface smoothness can be improved.

Further, by making the surfaces of the warps and wefts uniformly fuzzy according to the second aspect of the invention, in addition to the improvement in resin impregnation as well as in surface smoothness according to the first invention, the gigged filaments come into the resin between laminated glass fiber fabrics and fulfill an anchoring effect between the laminated fabrics so that delamination-resistant strength can be greatly improved. In addition, the resin content of the surfaces is increased by the gigged filaments, and the surface smoothness can be more improved by curing-molding.

In addition, according to the present invention, since resin impregnation to glass fiber fabric is uniform, the internal structure of the laminate becomes homogeneous so that shear stress is also uniform independent of positions. Accordingly, the dimensional stability is superior and the hole-walls formed by drilling working have good appearance, and further, the number of revolution and feed speed of the drill can be advantageously increased in drilling working. Further, because of uniformity of the internal structure, hole-forming can be simply made by punching working.

Figure 1:
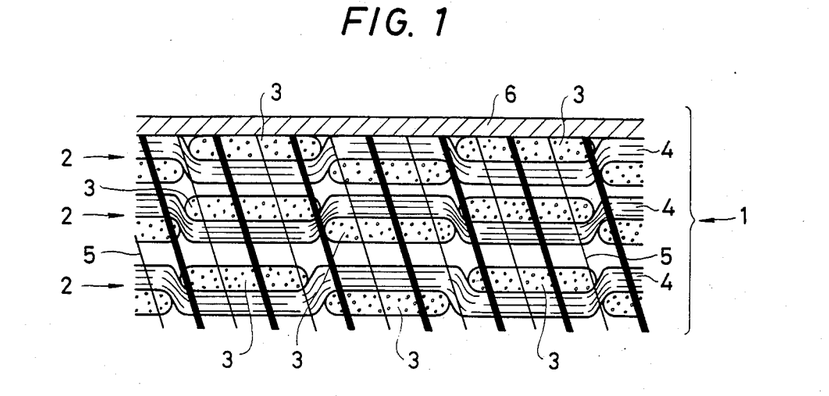
FIG. 1 is an enlarged sectional view of important parts in an embodiment of the first aspect of the invention.
Figure 2:
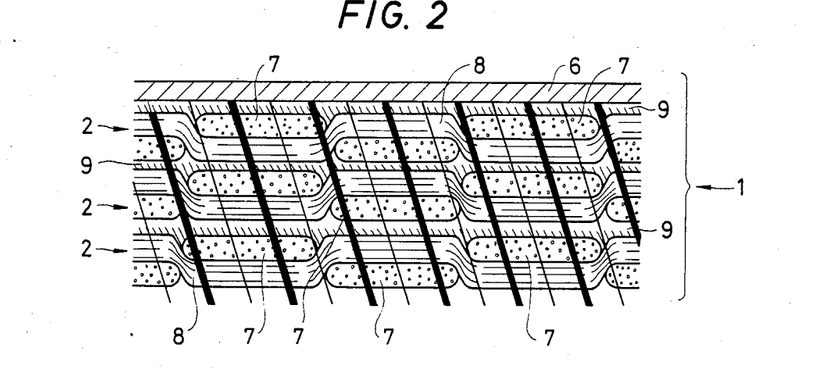
FIG. 2 is an enlarged sectional view of important parts in an embodiment of the second aspect of the invention.

FIGS. 1 and 2 show the first and second aspects of the invention, respectively, and now the first aspect of the invention will be described in detail with reference to FIG. 1.

In the first aspect of the invention, a substrate 1 has a plurality of laminated glass fiber woven fabrics. Warps 3 and wefts 4 forming the glass fiber fabrics have their filaments disjointedly open so as to be made flat, respectively. The warps 3 are closely adjacent to one another.

Synthetic resin 5 not only fills the gaps between the adjacent glass fiber fabrics 2 but also fully fills by impregnation the inside spaces of the warps 3 and wefts 4 forming the glass fiber fabrics 2, so that the synthetic resin inside the substrate 1 is almost homogeneous.

Accordingly the surfaces of the laminate are smooth, so that metal foil 6 mounted thereto can be kept smoothness microscopically.

FIG. 2 (in which the same reference numerals represent the same parts as those in FIG. 1) shows the second invention, in which warps 7 and wefts 8 forming laminated glass fiber fabrics 2 are provided with fuzz 9 which has even and dense surfaces. The fuzz 9 is fixed by the synthetic resin 5 existing in the gaps between the adjacent laminated glass fiber fabrics 2. Accordingly, the fuzz 9 shows an anchor effect between the glass fiber fabrics 2 to improve delamination strength greatly.

The quantity of impregnation of the synthetic resin 5 increases because of the high density of the surface fuzz 9, so that surface smoothness can be more improved by curing-molding.

Next, the first and second aspects of the inventions will be described in comparison with the conventional articles with respect to the properties of surfce smoothness, delamination, drilling working and punching working.

(1) Surface Smoothness

Used was a substrate for a printed circuit in which front and rear surface layers made of glass fiber fabrics (WE18WBZ$_2$) treated by high-pressure water jetting, and intermediate laminated layers of six prepreg sheets made of glass fiber fabrics not treated by high-pressure water jetting, were laminated (total: 8 sheets, 1.6 mm thick); and copper foil (18 $\mu$m) was further laminated on the outside of each of the front and rear surfaces of the laminate. Each of the synthetic resin and glass fiber fabrics used as prepreg sheets was the same as the used in the above-described resin impregnation test, and each of the glass fiber fabrics treated by high-pressure water jetting was the same those described in Table 1. Curing of the substrate was performed under the conditions with a pressure of 50 Kg/cm$^2$, a press-curing temperature of 170° C., and a press-curing time of 90 minutes.

Figure 5:
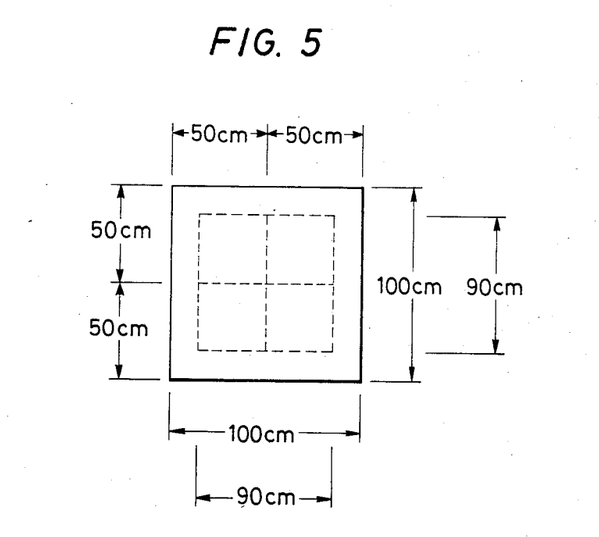
FIG. 5 is a view for explanation of the measuring method in surface smoothness tests.

Surface smoothness was measured under the condition that the length was set to 10 mm at each of 10 positions (total: 60 positions) taken on each of the six broken lines within a 100 cm square sample surfaces as shown in FIG. 5 in accordance with JIS B 0601 "Surface Roughness Test" by using an universal shape measuring machine (Tradename SEF-IA made by Kosaka Laboratory Ltd.), thereby obtaining the results as shown in Table 3. For the comparison, the measured results as to a conventional article in which the same 8 sheets of the same glass fiber fabric as those described above but not treated by high-pressure water jetting were laminated were described together.

TABLE 3

| | Jetting Press. | Found Values (unit: $\mu$m) | | |
|---|---|---|---|---|
| Substrate | (Kg/cm$^2$) | Min. | Max. | $\overline{X}$* |
| Conventional One | — | 7.2 | 9.3 | 7.9 |
| Using Sample No. 1 | 50 | 5.4 | 7.4 | 6.2 |
| Using Sample No. 2 | 100 | 4.6 | 6.5 | 5.0 |
| Using Sample No. 3 | 200 | 3.8 | 4.7 | 3.7 |
| Using Sample No. 4 | 300 | 2.7 | 3.6 | 2.8 |
| Using Sample No. 5 | 500 | 1.9 | 3.2 | 2.2 |

(Note)
(1) "Jetting Press." expresses jetting pressure exerted on glass fiber fabric by high-pressure water jetting. (The same shall apply hereinafter.)
(2) *Mean Value at n = 60

As apparent from Table 3, the surface smoothness of the printed circuit substrate using fabrics treated by high-pressure water jetting could be improved in comparison with that of the conventional one, and particularly, the surface smoothness of the printed circuit substrate using glass fiber fabrics treated by high-pressure water jetting with a jetting pressure of 300 Kg/cm$^2$ was not more than $\overline{X}=3$ $\mu$m, that is could be greatly improved to a half or less of that of the conventional article.

(2) Delamination

Glass fiber fabrics (WE18WBZ$_2$) each treated by high-pressure water jetting were used as the glass fiber fabrics. Prepreg sheets impregnated with epoxy resin and used in the above-described resin impregnation test were laminated on the above-mentioned water jetting treated glass fiber fabrics to thereby form substrates on the same molding condition as described above in the surface smoothness thest except that the sample thickness was set to 3 mm because of limitation according to the measuring method.

Delamination was measured by the short beam tripoint supporting method in accordance with ASTM D-2344 and the results were obtained as shown in Table 4. The measuring method and sample dimensions used were as follows.

| Measuring Method: | Span | 12 mm |
|---|---|---|
| | Loading Speed | 2 mm/minute |
| Sample Dimensions: | Thickness (Applox.) | 3.0 mm |
| | Width (Applox.) | 10 mm |
| | Length (Applox.) | 40 mm |

TABLE 4

| Substrate | Jetting Press. (Kg/cm$^2$) | Resin Content (%) | Mean Found value (Kg/mm$^2$) |
|---|---|---|---|
| Conventional One | — | 37.2 | 5.75 |
| Using Sample No. 1 | 50 | 37.6 | 5.80 |
| Using Sample No. 2 | 100 | 38.0 | 6.04 |
| Using Sample No. 3 | 200 | 38.4 | 6.72 |
| Using Sample No. 4 | 300 | 38.8 | 7.66 |
| Using Sample No. 5 | 500 | 39.5 | 7.87 |

As apparent from Table 4, the interaminar shear strength of the printed circuit substrate using fabrics treated with 5% in comparison with that of the conventional one, and particularly, the interlaminar shear strength of the printed circuit substrate using fabrics treated with a jetting pressure of from 300 Kg/cm$^2$ to 500 Kg/cm$^2$ could be improved by about 30–40%. The fiber made fuzzy by water jetting could be recognized to contribute to a property of delamination.

(3) Drilling Workability (A) Three kinds of prepreg sheets were made of the glass fiber fabrics of the respective samples Nos. 4 and 5 of Table 1 and the glass fiber fabrics not treated by water jetting ("Blank" of Table 1). Eight prepreg sheets of each kind were laminated and 18 $\mu$m thick copper foils were mounted onto the upper and lower surfaces of the laminate, thereby obtaining three kinds of laminated bodies which are then heated and pressed to obtain substrate each having a 1.6 mm thickness.

The resin content in each of the prepreg sheets was adjusted to about 40%. The composition of the used resin was as follows:

| | |
|---|---|
| EPICOAT 1001 | 100 parts |
| Dicyandiamide | 4 parts |
| BDMA | 0.2 parts |
| Methyloxytol (Applox.) | 100–150 parts |

The molding condition of the substrates was as follows:

| | |
|---|---|
| Pressure | 50 Kg/cm² |
| Pree-curing temperature | 170° C. |
| Press-curing time | 90 minutes |

The kind of the used glass fiber fabric and the resin content in the substrate are shown in Table 5.

TABLE 5

| Substrate | Used Glass Fiber Fabric (WE18WBZ$_2$) | Resin Content in Substrate (%) |
|---|---|---|
| Conventional One | Ordinary type × 8 sheets | 37.2 |
| Using Sample No. 4 | Jetting Press. 300 Kg × 8 sheets | 38.5 |
| Using Sample No. 5 | Jetting Press. 500 Kg × 8 sheets | 39.7 |

The three kinds of printed circuit substrates were compared with each other in drilling workability.

Under the following drilling conditions, roughness (μm) of the hole-walls was measured while changing the number of revolution and feed speed of the drill. The measurement was made by sectional microscopic examination.

Drilling Conditions (i) NC drilling machine: EXCELLON MARK V (made by EXCELLON Co., Ltd.)
(ii) Drilling Method:
Three substrates were superimposed for every kind.
Use of spade drill having a diameter of 1 mm. 0–7200 hits.
Assist plate of paper phenol plate; the upper side: 0.8 mm, and the lower side: 1.6 mm.
As the results of drilling working under those conditions, the roughness of the hole-walls are shown in Table 6.

TABLE 6

(unit: μm)

| Substrate | Conventional Type | | | Using Sample No. 4 (Jetting Pressure 300 Kg/cm²) | | | Using Sample No. 5 (Jetting Pressure 500 Kg/cm²) | | |
|---|---|---|---|---|---|---|---|---|---|
| Drill Feed (μ/rev) | 40/rev | 80/rev | 112/rev | 40/rev | 80/rev | 112/rev | 40/rev | 80/rev | 112/rev |
| Drill Rev No. (rpm × 10³) | | | | | | | | | |
| 40 | 18 | 20 | 19 | 11 | 12 | 12 | 8 | 9 | 8 |
| 60 | 13 | 28 | 25 | 8 | 12 | 14 | 8 | 10 | 10 |
| 80 | 11 | 22 | 32 | 7 | 15 | 18 | 7 | 9 | 12 |

From the results, it will be appreciated that the substrates according to the present invention are excellent in drill workability as well as in roughness of the internal walls. According to the present invention, good drilling working can be made under the conditions of the conventional conditions, so that it is possible to realize reduction in cost in hole-forming working.

(B) Six prepreg sheets of glass fiber fabric of Sample No. 5 of Table 1 were laminated, and 18 μm thick metal foils were mounted onto the upper and lower surfaces of the laminate to obtain a 1.6 mm thick substrate. For the comparison, four prepreg sheets of glass paper (tradename EP-4075: made Japan Vilene Co., Ltd.) were laminated, one sheet of glass fiber fabric of WE18WBZ$_2$ "Blank" of Table 1 was further laminated onto each of the upper and lower surfaces of the laminated body (total: 6 sheets), and then copper foils were mounted onto the upper and lower surface of the laminate, in the same manner as describe above, to thereby obtain a 1.6 mm thick substrate (CEM-3 type substrate). The used resin and the pressing condition were in the same manner as described above in (A). The resin content in the glass fiber fabric prepreg sheet and that in the glass paper prepreg sheet are as shown in Table 7.

TABLE 7

| | Resin Content of prepreg (%) |
|---|---|
| Glass paper EP-4075 | 74.5 |
| WE18WBZ$_2$ "Blank" of Table 1 | 39.0 |
| WE18WBZ$_2$ "No. 5" of Table 1 | 52.0 |

The glass member structure and resin content in the obtained substrate were as shown in Table 8.

TABLE 8

| Substrate | Glass Member Structure | Resin Content (%) |
|---|---|---|
| Comparison | WE18WBZ$_2$ "Blank" × 2 sheets EP-4075 × 4 sheets (Total: 6 sheets) | 65.7 |
| Using Sample No. 5 | WE18WBZ$_2$ "No. 5" × 6 sheets | 50.4 |

The two type substrate were compared in drilling workability. The measured result is shown in Table 9.

TABLE 9

(unit: μm)

| | Substrate | | | | | |
|---|---|---|---|---|---|---|
| | Comparison (CEM-3 Type) | | | Using Sample No. 5 | | |
| Drill | Drill Feed (μm/rev) | | | | | |
| Rev Number (rpm × 10) | 40/rev | 80/rev | 112/rev | 40/rev | 80/rev | 112/rev |
| 40 | 7 | 7 | 8 | 3 | 5 | 4 |
| 60 | 6 | 10 | 9 | 2 | 6 | 5 |
| 80 | 4 | 7 | 13 | 2 | 4 | 6 |

As shown in Table 9, the substrate according to the present invention has drilling workability which is equivalent or superior to the CEM-3 type laminated substrate which has been generally used. In view of the point that the CEM-3 type laminated substrate has a defect in molding of the glass paper at the time of the formation of a prepreg sheet, the substrate according to the present invention has an advantage that the substrate has not only the features of a laminated plate using glass fiber fabric as a basic material but drilling workability which is equivalent or superior to that of the CEM-3 type substrate.

(4) Punching Workability

The substrates of the type using the same No. 5 and of the comparison type as described in the item (B) of paragraph (3), and the substrate of glass fiber fabric not treated by water jetting (WE18WBZ$_2$ "Blank" of Table 1) were subject to punching workability test under the following conditions:

Punching Workability Test Method (i) Appearance Measurement with Eye in accordance with ASTM Estimation Standard.
  a. Punching Workability Testing Mold In accordance with ASTM D6177-44.
  b. Punching Workability Estimation Standard Appearance measurement with eye in accordance with ASTM.
(ii) Measurement of Punching Resistance and Drawing Resistance.
  a. Testing Condition: pin diameter 1 mm (Content of Mold) Clearance 0.1 mm (one side)
  b. Measuring Machine: Universal Testing Machine Type RH-100 (made by Shimazu Seisakusho, Ltd.)

The results of test in punching workability are shown in Tables 10 and 11.

TABLE 10

| Substrate | Estimation Marks | (marks) Propriety of Punching |
|---|---|---|
| Use of "Blank" of Table 1 | — | bad |
| CEM-3 Type | 80–90 marks | good |
| Use of No. 5 | 80–90 marks | good |

TABLE 11

| Substrate | Punching Temperature (°C.) | Specific Punching Shear Resist. (Kg/mm$^2$) | Specific Drawing Resist. (Kg/mm$^2$) | Thickness (mm) |
|---|---|---|---|---|
| Use of "Blank" in Table 1 | 20 | 12.4 | 3.8 | 1.52 |
| CEM-3 Type | 20 | 7.6 | 2.2 | 1.66 |
| Use of No. 5 | 20 | 7.9 | 2.7 | 1.63 |

From the above results, it will be appreciated that the substrate according to the present invention has punching workability which is equivalent or superior to the CEM-3 type substrate which has been generally used, and accordingly, punching working can be also performed thereon.

(5) Application of SMT (A) Positional Accuracy of Via-holes

Sample Substrate (Only the examples according to the specified invention are described below.)

TABLE 12

| Substrate | Used Glass Fiber Fabric (WE18WBZ$_2$) | Resin Content in substrate (%) |
|---|---|---|
| Conventional One | General Type × 8 sheets | 37.2 |
| Using Sample No. 1 | Jetting Press. 50 Kg × 8 sheets | 37.6 |
| Using Sample No. 2 | Jetting Press. 100 Kg × 8 sheets | 38.0 |
| Using Sample No. 3 | Jetting Press. 200 Kg × 8 sheets | 38.4 |

(Note)
(1) The resin composition is the same as that of the epoxy resin used in the resin impregnation test.
(2) The molding condition of the substrate is the same as that of the substrate used in the drilling workability test.

Drilling Condition (i) NC drilling machine: EXCELLON MARK V (made by EXCELLON Co., Ltd.).
(ii) Drilling Working Method: Drill diameter: 0.3 mm, Drill Feed: 40 μm/rev, Substrate thickness: 1.6 mm × 2 sheets, Assist plate: upper one 50 μm aluminum foil and lower one 160 μm paper phenol plate, Revolution speed: 80,000 rpm, Number of hitting: 6,000 hits.
(iii) Measuring Method: Positional accuracy of holes is estimated as follows.

Figure 7:
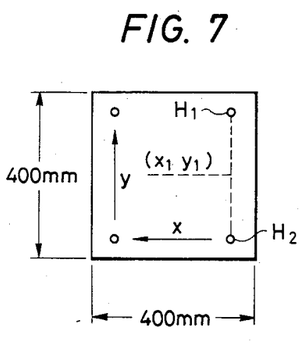
FIG. 7 is a plan view of the positional coordinates of the via-holes in the front surface of a MCL.
Figure 8:
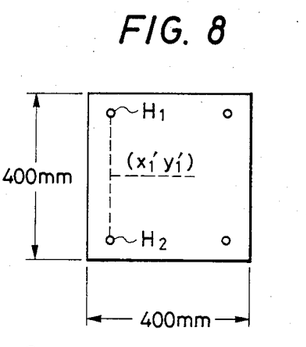
FIG. 8 is a plan view of the positional coordinates of the via-holes in the rear surface of the MCL of FIG. 7.

Holes H$_1$ and H$_2$ in the front surface of a sample substrate MCL as shown in FIG. 7 and the same holes H$_1$ and H$_2$ in the rear surface as shown in FIG. 8 are regarded as the points of origin, respectively. The front surface coordinates (x$_1$, y$_1$) of a plurality of holes hit from the surface of FIG. 7 and the coordinates (x'$_1$, y'$_1$) of the corresponding holes of FIG. 8 are measured by a three-dimensional coordinates measuring machine (made by Mitsutoyo Seisakusho Co., Ltd.) to calculate the positional displacement on the basis of the respective coordinates of the front and rear holes.

(iv) Results of Measurement

TABLE 13

| Substrate | Positional Displacement between the rear and front surfaces on MCL (μm) | | |
|---|---|---|---|
| | Min | Max | $\overline{X}$ (n = 100) |
| Conventional One | 30.5 | 118.6 | 50.3 |
| Using Sample No. 1 | 17.6 | 57.8 | 35.2 |
| Using Sample No. 2 | 19.2 | 47.9 | 25.4 |
| Using Sample No. 3 | 4.1 | 38.0 | 20.8 |

From the results in Table 13, it is clearly recognized that the displacement of the via-holes in the substrate in accordance with the specified invention can be improved.

Figure 9:
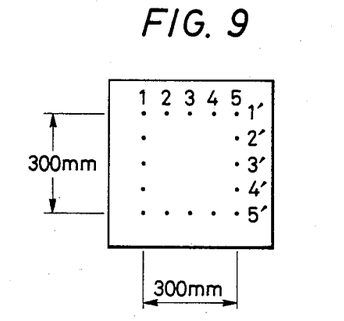
FIG. 9 is a plan view of the positional coordinates of the via-holes in the front surface of the MCL for the measurement of changes in dimensions.

(B) Change in Dimensions (i) The same sample substrates as those used in the test of positional accuracy of the via-hole were used, five via-holes were formed in each of the substrates in an area of 300 mm square as shown in FIG. 9, and one of the substrates which was then etched and washed with water and another substrate which was then heated at 170° C. for 30 minutes were subject to measurement of changes in dimension of the respective substrates by using the three-dimensional coordinates measuring machine in the same manner as above. In this case, as shown in FIG. 9, the changes in dimensions were measured on the two MCLs at 5 points lengthwise and breadthwise, summing up 10 points, in the area of 300 mm square.

(ii) Result of Measurement

TABLE 14

| | | Rate of Change in Dimension (%) | | | | | |
|---|---|---|---|---|---|---|---|
| | | After Etching | | | After Heating | | |
| | | Min. | Max. | X (n = 10) | Min. | Max. | X (n = 10) |
| Conventional One | Ordinate (y) | 0.005 | 0.015 | 0.009 | −0.010 | −0.033 | −0.024 |
| | Abscissa (x) | 0.008 | 0.015 | 0.010 | −0.040 | −0.054 | −0.046 |
| Using Sample No. 1 | Ordinate (y) | 0.006 | 0.015 | 0.008 | −0.012 | −0.020 | −0.015 |
| | Abscissa (x) | 0.006 | 0.017 | 0.009 | −0.018 | −0.035 | −0.026 |
| Using Sample No. 2 | Ordinate (y) | 0.005 | 0.010 | 0.006 | −0.010 | −0.018 | −0.014 |
| | Abscissa (x) | 0.005 | 0.012 | 0.007 | −0.015 | −0.030 | −0.022 |
| Using Sample No. 3 | Ordinate (y) | 0.003 | 0.010 | 0.005 | −0.007 | −0.017 | −0.011 |
| | Abscissa (x) | 0.005 | 0.012 | 0.007 | −0.015 | −0.030 | −0.019 |

As described above, since the first aspect of the invention uses the glass fiber fabric forming warps and wefts which are disjointedly opened, it is possible to make the resin impregnation uniform to thereby improve the surface smoothness as well as to thereby improve the delamination property. In addition, it is possible to provide a substrate for a printed circuit which is excellent in drilling workability.

Further, according to the second aspect of the invention, the surfaces of the warps and wefts are subject to gigging to thereby make it possible to improve the delamination property more greatly and make it possible to increase the resin impregnation due to the fuzzy fibers.

In addition, according to the present invention, the whole substrate can be made homogeneous to thereby simplify drilling working. Accordingly, there is an advantage that the producibility can be improved and the manufacturing cost can be reduced.

A multilayer printed circuit substrate in accordance with the present invention will be explained.

The rate of use of multilayer printed circuit substrates has increased. A multilayer printed circuit substrate has multiple layers of printed circuits in the internal portions thereof as well as, of course, in the front and rear surfaces thereof, to thereby make it possible to shorten the distances between parts and reduce sharply the number of parts as well as the number of connection portions in electronic circuits, in cooperation with integrated circuits such as ICs, LSIs, super LSIs.

However, since the multilayer printed circuit substrates are provided with complex and accurate electronic circuits, the materials used for the multilayer printed circuit substrates are severely required to have extremely higher quality in comparison with general purpose double-face printed circuit substrates. Accordingly, selection of arrangement of lamination in the multilayer printed circuit substrates becomes an important factor.

Above all, multilayer printed circuit substrates using glass cloth prepregs are required to have high-level surface smoothness, thickness accuracy, dimensional stability, heat-resisting property, etc. In the multilayer printed circuit substrates used nowadays, high cost, thin glass cloth of 100 μm order thick, (for example, tradename WE116EBZ$_2$, Nitto Boseki Co., Ltd., or the like) is mainly used.

To reduce the cost, there have been used a multilayer substrate arranged such that a substrate made of glass cloth prepreg of general purpose glass cloth of a 200 μm order thickness (for example, tradename WE18WBZ$_2$ made by Nitto Boseki Co., Ltd., or the like) impregnated with resin (hereinafter abbreviated to "WE18W prepreg") is sandwiched between substrates each made of made of a glass cloth prepreg of WE116EBZ$_2$ (hereinafter abbreviated to "WE116E prepreg"), a multilayer substrate arranged such that the WE116E prepregs and WE18W prepregs are laminated in combination, and so forth. Being composed mainly of expensive WE116E, it is not avoidable that such proposed substrates as described above become expensive.

If all the WE116E prepregs can be replaced by the WE18W prepregs in the above-described conventional multilayer printed circuit substrate, it is possible to reduce the cost of the substrate, but it is impossible to keep the high-level properties required for the multilayer printed circuit substrate as described above.

The replacement of the WE116E prepreg by the WE18W prepreg not only makes it difficult to keep the above-mentioned properties but causes a problem in press-molding. That is, the WE18W prepreg has a defect the thickness thereof is not so accurate when compared with the WE116E prepreg. In the case where the WE18W prepreg is excessively impregnated with resin for make the thickness accurate, the resin may be applied onto the surfaces of the glass cloth, resulting in causes of occurrence of slippage between prepregs in press-molding.

When a plurality of printed circuit substrates are stacked to provide a multilayer printed circuit substrate, there is a case where glass cloth prepregs are interposed between the adjacent substrates in order to improve the adhesive therebetween. In this case, as the glass cloth prepregs used, generally used are the WE116E prepregs which are thin and become rich in resin content to thereby fulfill a function of adhesion.

Compared with this, the use of the WE18W prepregs is inferior in adhesion since the resin content thereof is low. The use of a large amount of resin to compensate for the insufficient adhesion causes such a substrate slipping or displacement phenomenon as described above which becomes an obstacle in press molding. Accordingly, it is necessary to use the WE116E prepregs even in the case where glass cloth prepregs are used for the purpose of adhesion.

On the other hand, the requirement to miniaturize electronic appliances and to make the same have a high performance has brought multilayering and high density onto printed circuit substrates as well as has produced a development of a new technology named Surface Mounted Technology (abbreviated to "SMT") in the field of the art with respect to mounting of parts such as LSI chips or the like onto printed circuit substrates.

This SMT is a technique for soldering lead wires of LSI chips or the like directly onto the surfaces of wiring substrates. Conventionally, the lead wires of LSI chips or the like are soldered while inserted in holes formed in the circuit substrates and soldered thereat. However, with the advance of high performance and miniaturization of LSI chips or the like, the number of lead wires increases and the pitch between the lead wires becomes smaller, so that it is difficult to solder the lead wires while inserted in the holes of the substrates.

According to the SMT, the lead wires of LSI chips or the like are soldered directly onto the surfaces of the circuit substrtes so that the parts mounting can be easily performed and it is possible not only to cope with the requirement of miniaturization of LSI chips or the like but to perform parts mounting onto both the opposite surfaces of an LSI chip or the like that could been performed onto only one of the surfaces of the same conventionally. Accordingly, the mounted density can be greatly improved, so that the SMT has become a main current of parts mounting technology in multilayer printed circuit substrates.

One of the features of printed circuit substrates for SMT is that the substrates have a lot of via-holes having a small diameter. It is therefore an important problem how to form such via-holes of 0.2–0.3 mm diameter with high positional accuracy and high reliability since substrates necessarily have a large aspect ratio as the circuits becomes complicated and the print circuit substrates are made multilayered.

However, the multilayer printed circuit substrate using conventional WE18W prepreg has a defect that holes in the rear surface are displaced as described before in conjunction wth FIG. 6 in the case where hole boring is performed by using a small diameter drill, so that it is difficult to form via-holes vertically. Also for this reason, it is impossible to replace the WE116E prepreg of the multilayer printed wiring substrate by the WE18W prepreg.

The glass cloth used according to the present invention is woven by constituent threads made of an aggregate of several hundreds of glass fiber monofilaments each having a filament diameter of about 9 $\mu$m. Further, the filaments forming warps and wefts are disjointed by some mechanical impact (for example, injection of high-pressure water jet onto the surfaces thereof, etc.) as described before.

Table 15 shows the impregnation property of the resin within the glass cloth prepreg in the case where high-pressure water jetting is applied to the surfaces of glass cloth while changing the pressure thereof.

TABLE 15

| Sample | Jetting press.(Kg/cm$^2$) | WE18WBZ$_2$ | WE116EBZ$_2$ |
|---|---|---|---|
| | | | (unit: minute-second) |
| Blank | — | 14'-52" | 7'-25" |
| No. 1 | 50 | 5'-13" | — |
| No. 2 | 100 | 3'-36" | — |
| No. 3 | 200 | 1'-31" | — |

(Note)
"Blank" represents glass cloth not treated by pressure water jetting.

The resin used herein is epoxy resin composed of the following components, and the resin impregnation test is a test for measuring time from dropping of a given quantity (10 cc) of resin onto a given area (10 cm×10 cm) of cloth till bubbles within strands have come out.

| Resin composition: | |
|---|---|
| Araldite 8011 A-70 (tradename of brom-epoxy resin: made by Ciba Geigy Ltd.) | 100 parts by weight |
| Dicyandiamide | 32 parts by weight |
| Benzyldimethylamine | 0.16 parts by weight |
| Methylceloosolve (Applox.) | 30 parts by weight |

As is in the foregoing cases, the apparatus for generating high-pressure water jet, used herein, is that disclosed in Japanese Patent Publication No. 57-22692. All the kinds of the glass cloth used are articles of commerce made and sold by Nitto Boseki Co., Ltd.

As apparent from Table 15, it is recognized that the filaments of the warps and wefts of WE18WBZ$_2$ are opened by the water jetting to thereby greatly improve resin impregnation speed, and, as the pressure of jetting is made higher the impregnation speed can be improved more extremely, the resin impregnation speed in the WE18WBZ$_2$ being higher than that in the glass cloth of WE116EBZ$_2$.

Table 16 shows the changes in resin content in glass cloth prepreg when the same glass cloth and the same resin as those used in the case of Table 15.

TABLE 16

| Sample | Jetting Press.(Kg/cm$^2$) | WE18WBZ$_2$ | WE116EBZ$_2$ |
|---|---|---|---|
| | | | (unit: %) |
| Blank | — | 44.2 | 50.5 |
| No. 1 | 50 | 45.4 | — |
| No. 2 | 100 | 46.7 | — |
| No. 3 | 200 | 47.3 | — |

(Note)
The test was performed in accordance with JIS R 3420 5.3 "Glass Fiber General Test".

As apparent from Table 16, it is recognized that the resin content in the WE18W prepreg using WE18WBZ$_2$ increase as the jetting pressure is made higher, that is, the resin content thereof closely resembles that of prepreg using WE116EBZ$_2$.

As described above, in a general purpose WE18W prepreg, the warps and wefts of glass cloth are disjointedly opened by high-pressure water jetting so that the resin can be impregnated into the glass cloth at a high speed and uniformly all over the cloth. Further, since the resin impregnation is sufficient, it is possible to sufficiently effectively perform heat-pressing in curing, and since the warps and wefts are disjointedly opened, it is possible to make the intersections of the warps and wefts flat, and therefore to improve the surface smoothness.

Further, since the inside of between the filaments of the glass cloth is impregnated with the resin sufficiently, the problem of insufficient accuracy in thickness can be solved. In addition, there occurs slipping or displacement in molding of WE18W prepregs employing general purpose WE18WEBZ$_2$, and, accordingly, the replacement by the glass cloth of general purpose WE18WBZ$_2$ is enabled.

In addition, since the resin is impregnated uniformly into glass cloth, the internal structure of the glass cloth prepreg is made homogeneous so that shear stress is also uniform independent of positions. Accordingly, the displacement of the small-diameter via-holes in SMT can be improved, and also in this point of view the replacement by WE18W prepreg made of general purpose WE18WBZ$_2$ glass cloth is enabled in multilayer printed circuit substrates.

In addition, the disjointedly opening (filamentation) of the warps and wefts of glass cloth reduces internal stress generated in weaving of glass cloth to thereby eliminate distortion in the cloth, so that the dimensional stability of the printed circuit substrate which might be deteriorated by the internal stress can be improved.

Figure 10:
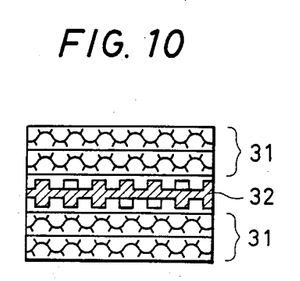
FIG. 10 is a view for explanation of an embodiment of the multilayer printed circuit substrate according to the present invention.
Figure 11:
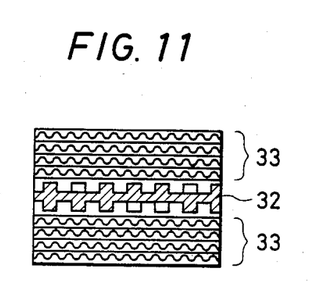
FIGS. 11 through 13 are views for explanation of the various conventional multilayer printed circuit substrates.
Figure 12:
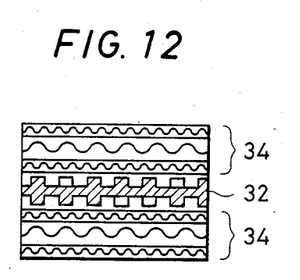
Figure 13:
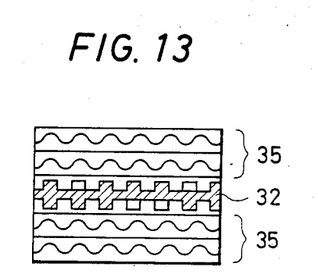

There were prepared three types of substrates in each of which an electric circuit 32 was sandwiched between a pair of laminates 31 and 31 as shown in FIG. 10, each laminate being constituted by two same prepregs selected from the WE18W prepregs Nos. 1 to 3 prepared in Table 16. (The three types of substrates were named Sample Nos. 4, 5 and 6 corresponding to the respective cases where the glass prepreg Nos. 1, 2 and 3 were used.) For the sake of comparison, there were prepared a comparison substrate (currently used standard one) in which an electric circuit 32 was sandwiched between a pair of laminates 33 and 33 as shown in FIG. 11, each laminate being constituted by four same WE116E glass cloth prepregs "Blank" listed in Table 15; another comparison substrate in which an electric circuit 32 was sandwiched between a pair of laminates 34 and 34 as shown in FIG. 12, each laminates being constituted by two same WE116E blank glass cloth prepregs and one WE18W blank glass cloth prepreg; and a further comparison substrate in which an electric circuit 32 was sandwiched between a pair of laminates 35 and 35 as shown in FIG. 13, each laminate being constituted by two same WE18W blank glass cloth prepregs. (Those comparison substrates shown in FIGS. 11, 12 and 13 were named Sample Nos. 7, 8 and 9, respectively.) All of the samples Nos. 4 to 9 were examined by comparison test in the items of surface smoothness, thickness accuracy, dimensional stability, heat-resisting property and molding property and the results as shown in Table 3 were obtained. All samples were subject to molding under the following conditions (except for testing of molding property).

| Pressure | 40 Kgc/cm$^2$ |
|---|---|
| Press-curing temperature | 170° C. |
| Press-curing time | 90 minutes |

TABLE 17

| Sample No. | No. 4 | No. 5 | No. 6 | No. 7 | No. 8 | No. 9 |
|---|---|---|---|---|---|---|
| Surface Smoothness | Δ | O | O | O | O | X |
| Thickness Accuracy | | | | | | |
| Level | Δ | O | O | O | O | X |
| Deviation | O | O | O | O | Δ | Δ |
| Dimensional Change | | | | | | |
| x-direction | Δ | O | O | O | Δ | X |
| y-direction | O | O | O | O | O | X |
| Heat Resist. | | | | | | |
| Infrared Fusing | | | | | | |
| Once | Δ | O | O | O | O | X |
| Twice | Δ | Δ | O | Δ | Δ | X |
| Soldering Time (sec.) | 20  40 | 20  40 | 20  40 | 20  40 | 20  40 | 20  40 |
| Boiling (hour) | | | | | | |
| 1 | O  Δ | O  O | O  O | O  O | O  Δ | O  Δ |
| 2 | Δ  X | O  Δ | O  O | O  Δ | Δ  Δ | X  X |
| Molding | Δ | O | O | O | O | X |

TABLE 17-continued

| Sample No. | No. 4 | No. 5 | No. 6 | No. 7 | No. 8 | No. 9 |
|---|---|---|---|---|---|---|
| Property | | | | | | |

ESTIMATION METHOD AND ESTIMATION STANDARD

Estimation Method (1) Surface smoothness: Surface roughness of copper foil was measured by universal shape measuring machine (made by Kosaka Laboratory Ltd.).
(2) Thickness accuracy: Thickness was measured by a micrometer (made by Mitsutoyo Seisakusho Co., Ltd.) inside and outside circuit patterns.
(3) Dimensional change: Dimensional change in x- and y-directions were measured by a three-dimensional coordinates measuring machine (made by Mitsutoyo Seisakusho Co., Ltd.)
(4) Heat-resisting property:
 (a) Infrared fading: After etched substrates were treated once or twice by an infrared fusing apparatus (made by Research Co., Ltd.), measurement was made with the eye.
 (b) Boil-soldering: After etched substrates cut to divide into pieces of 40×40 mm, the pieces were boiled for one hour and two hours respectively, soaked into a melted solder bath of 260° C. for 20 and 40 seconds respectively, and then subject to measurement with the eye.
(5) Molding property: Substrates molded under three conditions of molding pressure of 40, 50 and 60 Kg/cm$^2$ were subject to comparison estimation as to existence of occurence of slipping or displacement.

Estimation Standard (1) Heat-resisting property: (This standard was applied to Infrared fusing and boil-soldering.)
 O . . . No abnormality
 Δ . . . Presence of measling
 X . . . Presence of blister
(2) Other properties were estimated on the basis of Sample No. 4 (currrently used standard one) as a reference.
 O . . . Equal to Sample No. 4
 Δ . . . A little inferior to Sample No. 4
 X . . . Inferior to Sample No. 4

As apparent from Table 17, it is recognized that Sample nos. 4 to 6 could almost keep the various properties equally to Sample No. 7 (currently used standard one).

A sample circuit substrates of the conventional type, and three circuit substrates Sample Nos. 10, 11 and 12 were prepared as shown in Table 18, and after boring by a small-diameter drill, those substrates were subject to measurement of displacement of holes.

TABLE 18

| kind of Substrate | Used Glass Cloth (WE18WBZ$_2$) | Resin Content in Substrate (%) |
|---|---|---|
| Conventional type | Non-treated glass cloth × 8 sheets | 40.0 |
| No. 10 | Jetting Press. 50 Kg/cm$^2$ × 8 sheets | 41.4 |
| No. 11 | Jetting Press. 100 Kg/cm$^2$ × 8 sheets | 42.6 |
| No. 12 | Jetting Press. 200 Kg/cm$^2$ × 8 sheets | 43.8 |

ESTIMATION METHOD (1) Drilling Apparatus:
  NC drilling machine: Excellon Mark V (made by Excellon Co., Ltd.)
(2) Drilling Method:
  Drill diameter: 0.3 mm, Feeding speed: 40 μm/rev
  Thickness: 1.6 mm
  Doubling plate (upper: 50 μm aluminum foil, lower: 160 μm paper phenol plate)
  Number of stacked sheets: 2 sheets
  Number of revolution: 80,000 rpm
  Number of hitting: 6,000 hits
(3) Measuring Method:
  Hole-position accuracy was estimated as follows:
  The Holes $H_1$ and $H_2$ in the front surface of a sample substrate (hereinafter referred to as "MCL") as shown in FIG. 7 and the holes $H_1$ and $H_2$ in the rear surface of the same as shown in FIG. 8 were regarded as the points of origin, respectively. The front surface coordinates $(x_1, y_1)$ of a plurality of holes hit from the surface of FIG. 7 and the coordinates $(x'_1, y'_1)$ of the corresponding holes of FIG. 8 were measured by a three-dimensional coordinates measuring machine (made by Mitsutoyo Seisakusho Co., Ltd.) to calculate the displacement therebetween on the basis of the respective coordinates of the holes in front and rear holes.
(4) Results of Measurement:

TABLE 19

| Kind of Substrate | Positional Gap between the rear and front surfaces of MCL (μm) | | |
|---|---|---|---|
| | Min. | Max. | $\overline{X}$ (n = 100) |
| Conventional Type | 28.4 | 120.7 | 42.0 |
| No. 10 | 15.2 | 60.1 | 37.6 |
| No. 11 | 11.1 | 49.8 | 27.6 |
| No. 12 | 5.9 | 40.3 | 22.5 |

As apparent from Table 19, it has been proved that the displacement of via-holes in the substrates in accordance with the present invention could be so improved that the substrates according to the present invention are sufficiently useful as those for SMT.

As described above, according to the present invention, glass cloth prepregs made of general purpose glass cloth with its filaments opened and sufficiently impregnated with resin are used, so that it is possible to provide substrates inexpensively, which can be used to constitute a multilayer printed circuit substrate constituted by a plurality of stacked printed circuit substrates, in which the properties of surface smoothness, thickness accuracy, dimensional change, and heat-resistance can be kept at a higher level, and in which small-diameter via-holes formed therein are superior in hole-position accuracy.

According to the present invention, it is possible to replace the very thin glass cloth of a thickness not more than 50 μm by the WE116E glass cloth subjected to opening treatment.

We claim:

1. A substrate for a printed circuit, in which a metal foil is mounted onto at least one of the outermost surfaces of a laminate made of a plurality of glass fiber woven fabrics comprised of warps and wefts impregnated with synthetic resin, and heated and pressed wherein said warps and wefts are in the form of threads comprised of a plurality of filaments, the filaments of said glass fiber woven fabrics being open, such that said synthetic resin fills gaps among the opened said filaments so that the said laminated glass fiber woven fabrics including the opened filaments are integrally joined with each other.

2. A substrate for a printed circuit, in which a metal foil is mounted onto at least one of the outermost surfaces of a laminate made of a plurality of glass fiber woven fabrics comprised of warps and wefts impregnated with synthetic resin, and heated and pressed, wherein said warps and wefts are in the form of threads comprised of a plurality of filaments, the filaments of said glass fiber woven fabrics being open and their surfaces being fuzzy, such that said synthetic resin fills gaps among the opened and fuzzy said filaments so that the said laminated glass fiber woven fabrics including the opened and fuzzy filaments are integrally joined with each other.

3. A multilayer printed circuit substrate, in which a plurality of glass cloth prepregs impregnated with synthetic resin are laminated; metal foil is mounted onto the outermost surfaces thereof; and the laminate is heated and pressed, wherein warps and wefts of said glass cloths are in the form of threads comprised of a plurality of filaments, the filaments being opened, such that said synthetic resin enters gaps among the opened filaments to thereby integrally join and laminate said glass cloth prepregs to each other.

4. A multilayer printed circuit substrate according to claim 3, in which a plurality of multilayer printed circuit substrates are stacked, heated and pressed.

5. A multilayer printed circuit substrate according to claim 4, in which electric circuits are formed on surfaces of internally stacked ones of said plurality of stacked, heated and pressed multilayer printed circuit substrates.

6. A multilayer printed circuit substrate according to claim 4 or 5, in which glass cloth prepregs are interposed between the adjacent ones of said plurality of stacked, heated, and pressed multilayer printed circuit substrates.

7. A multilayer printed circuit substrate according to claim 6, in which warps and wefts of glass cloth of said glass cloth prepregs have their filaments opened.

* * * * *